Sept. 19, 1967 A. REISMAN ETAL 3,342,652

CHEMICAL POLISHING OF A SEMI-CONDUCTOR SUBSTRATE

Filed April 2, 1964 2 Sheets-Sheet 1

INVENTORS
ARNOLD REISMAN
ROBERT L. ROHR
BY
Allen A. Meyer, Jr.
ATTORNEY

United States Patent Office 3,342,652

Patented Sept. 19, 1967

3,342,652
CHEMICAL POLISHING OF A SEMI-CONDUCTOR SUBSTRATE

Arnold Reisman, Yorktown Heights, and Robert L. Rohr, Scarsdale, N.Y., assignors to International Business Machines Corporation, New York, N.Y., a corporation of New York Filed Apr. 2, 1964, Ser. No. 356,793
5 Claims. (Cl. 156—17)

This invention relates to a process for chemically polishing single crystal wafers of Ge and GaAs at room temperature so as to obtain damage-free, planar surfaces. More particularly, the invention relates to the use of oxychloride solutions in conjunction with a rotating wheel assembly to achieve nonselective etching of all common Ge and GaAs crystallographic orientations so as to obtain highly polished, damage-free, planar surfaces suitable for epitaxial growth or other semi-conductor applications. Furthermore, this invention relates to processes for polishing all common Ge and GaAs single crystal orientations independent of doping level and resistivity type so as to obtain highly polished, damage-free, planar surfaces.

While a variety of chemical agents are known which will dissolve Ge and GaAs, consequently, which will etch these materials, the majority of etchants are preferential or selective. Thus, the surface of a given crystallographic orientation of single crystal Ge or GaAs etches at different rates along the different crystallographic planes intersecting this surface. Such etchants are termed selective etchants because of the nature of their etching behavior, thus one cannot employ them to obtain mirror smooth planar surfaces. While at least two nonselective solution etches are known for GaAs, neither is useful for all crystallographic orientations. As far as Ge is concerned, heretofore, not a single nonselective room temperature etching technique has been available. Sodium oxychloride solution is known to have a solubilizing effect on Ge and has been used as an etchant. Unfortunately, for the conditions under which it has been employed, its behavior has been as a selective etch whose end result is a surface marred by pitting. Also, hypochlorite etched Ge exhibits a so-called cobblestone or orange peel appearance. Similar effects are obtained when Ge is etched by a "white etch", i.e., a mixture containing five parts $HNO_3$ to one part HF.

This invention relates to a process using Na oxychloride as an etchant whose end result is a polished, damage-free surface—free from all undesirable attributes previously observed in utilizing known Ge solubilizers as chemical polishes. Furthermore, this invention relates to processes for obtaining high quality, damage-free, planar polishes on all common Ge crystallographic orientations. Furthermore, this invention relates to processes for obtaining high quality, damage-free, planar polishes on all common GaAs crystallographic orientations. Uniquely, the process of the invention enables polishing of both the Ga and As surfaces of GaAs wafers oriented perpendicular to the <111> crystallographic direction. Uniquely, also, this process enables polishing of all common GaAs and Ge crystallographic orientations, independent of doping level or conductivity type, so as to obtain highly polished, damage-free, planar surfaces. While NaOCl will be discussed in detail, equivalent results are obtainable with KOCl or other oxidizing oxychloride solutions.

It is an object of the invention to chemically polish single crystal wafers of Ge and GaAs.

Another object of this invention is to obtain planar, damage-free, polished, single crystal wafers of GaAs and Ge.

Still another object of this invention is to chemically polish all common crystallographic orientations of Ge and GaAs, including both the As and Ga surfaces of wafers oriented perpendicular to the <111> direction in GaAs.

A further object of the invention is to chemically polish n-type Ge and GaAs at any doping level so as to obtain a planar, damage-free polished single crystal wafer.

Still a further object of the invention is to chemically polish p-type Ge and GaAs at any doping level so as to obtain a damage-free, planar, polished single crystal wafer.

Further, still another object of the invention is to chemically polish all common crystallographic orientations of GaAs and Ge of either p or n conductivity type at all doping levels at room temperature to obtain planar, damage-free, planar polished single crystal wafers at GaAs and Ge.

It is also an object of the invention to chemically polish all the crystallographic orientations of Ge and GaAs of either p or n conductivity type at all doping levels using sodium oxychloride solutions at room temperature to obtain damage-free, planar polished single crystal wafers of Ge and GaAs.

The foregoing and other objects, features and advantages of the invention will be apparent from the following more particular description of preferred embodiments of the invention, as illustrated in the accompanying drawings.

Figure 1:
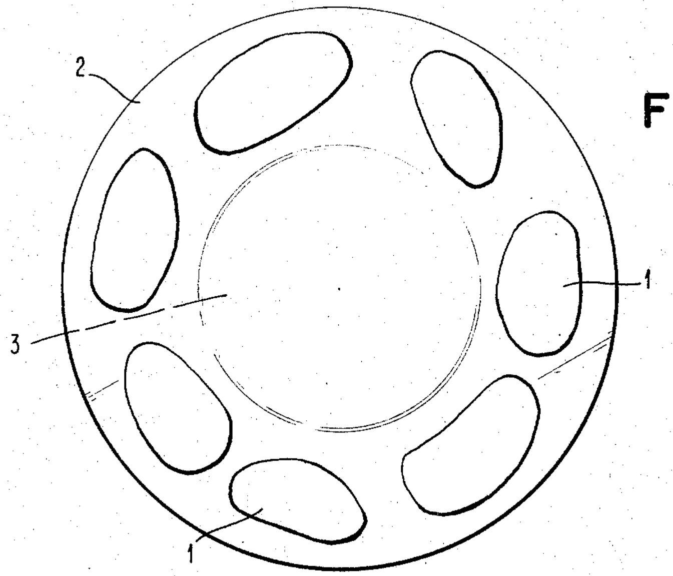
FIG. 1 is an enlarged view of the bottom of the wafer-plate assembly showing the wafers attached to the circular disc.
Figure 2:
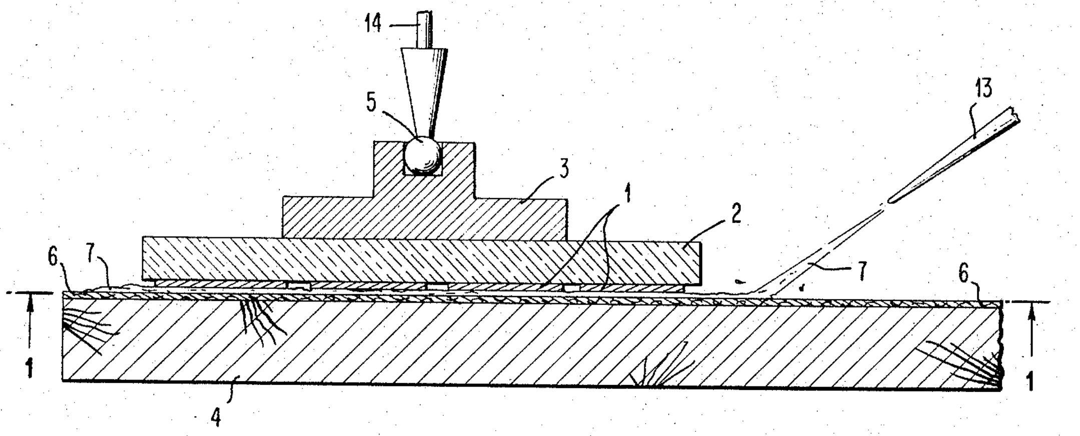
FIG. 2 is an enlarged view in cross-section of the wafer-plate assembly positioned on the lapping wheel and showing the ball and socket joint of the wafer-plate assembly.

The chemical polishing process of the invention with respect to Ge and GaAs single crystal wafers involves the following sequence of generalized steps:

Single crystal wafers of Ge or GaAs of desired crystallographic orientation, (e.g., <111>, <110>, <100>, <211>, etc.), conductivity type (e.g., n or p), and impurity concentration (e.g., approximately $1\times10^{15}$ to approximately $1\times10^{19}$ impurity atoms per cubic centimeter), are cut from single crystal ingots using diamond or other suitable saws. These wafers are affixed to a circular Pyrex or quartz disc or plate with glycol phthalate or other suitable adhesives such as wax. The wafers 1 plus the plate 2 to which they are affixed will hereinafter be termed "the wafer-plate assembly" 1, 2 shown schematically in FIG. 1. On the opposite side of the plate to which the wafers are affixed, the wafer-plate assembly has attached to its center a ball joint socket 3 (FIG. 2), this socket allows free rotation of the wafer-plate assembly when the latter is positioned on the lapping wheel or plate 4 by the ball joint 5. These wafers are lapped to uniform thickness on the lapping wheel 4 using aluminum oxide, diamond, or other suitable lapping grit. The lapped wafers while still affixed to the wafer-plate assembly are cleaned ultrasonically in dilute anionic detergent solution or trisodium phosphate rinsed ultrasonically in deionized water, rinsed ultraosnically in transistor grade trichloroethylene and rinsed ultrasonically in transistor grade methyl alcohol. While still affixed to the wafer-plate assembly, the wafers are dried by a stream of $N_2$ and the wafer-plate assembly is mounted on lapping wheel 4, no weight other than that due to the wafer-plate assembly being applied. Lapping wheel 4 is covered with a non-woven textile polishing cloth 6. The cloth preferably should be a blend of rayon and cotton fibers bonded together with a thermoplastic binder (e.g., a nitrile rubber). The polishing cloth should be uniformly and heavily napped across the entire surface and have a cloth thickness of approximately 22–25 mils. (An example of such a polishing cloth is Pellon PAN–W and is a material such as disclosed in U.S. Patent No. 2,719,802 and prepared by the process disclosed in U.S. Patent No. 2,719,806.)

Figure 3:
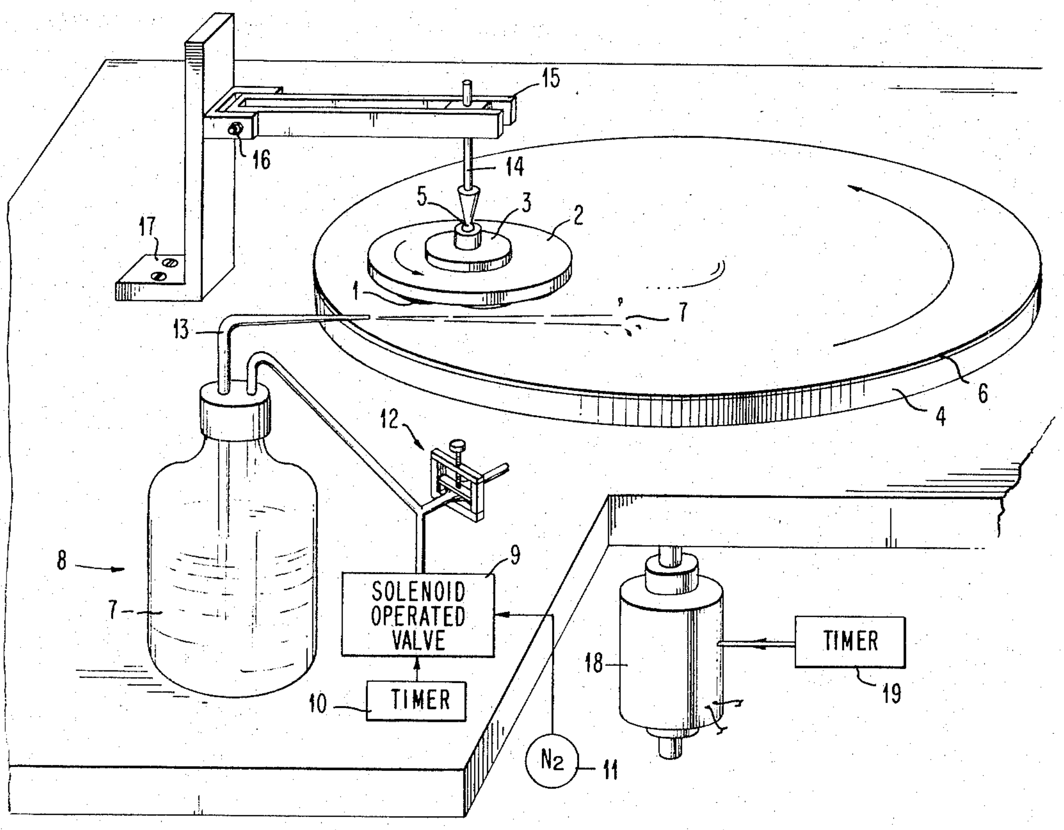
FIG. 3 is a perspective view of the polishing apparatus of the invention.

With the lapping plate 4 rotating at a constant speed (e.g., 62 r.p.m.), sodium oxychloride solution is applied in bursts as a stream to the surface of the polishing cloth 6 forming a liquid layer 7 between the cloth 6 and the wafers 1 to be polished. The NaOCl solution may be applied from the dispensing bottle 8 either manually or preferably automatically by the arrangement shown in FIG. 3. In this arrangement, a solenoid operated valve 9 actuated by a timer 10 periodically admits $N_2$ under pressure from source 11 into the dispensing bottle 8. The quantity of solution dispensed in each cycle is governed by the bleed valve 12. The $N_2$ pressure forces NaOCl out through the nozzle 13 onto the polishing cloth 6. The NaOCl solution is applied tangentially to the wafer-plate assembly as shown in FIG. 3 so as to provide maximum washing of the polishing cloth in order to remove waste etching products.

The wafer-plate assembly is positioned by the ball and socket arrangement 3 and 5. The ball joint 5 is affixed via the shaft arm 14 to the pivot arm 15 which, in turn, is free to move in a vertical direction while rotating on the pivot pin 16, the latter being firmly positioned by the bracket 17. This arrangement permits the wafer-plate assembly to freely rotate and to exhibit vertical displacement. Thus, during the polishing operation, both the lapping wheel 4 and wafer-plate assembly 1, 2 rotate simultaneously. The rotation of the wafer-plate assembly is caused by the friction between the wafers and the liquid layer between the wafers and polishing cloth. The lapping wheel 4 is rotated by the motor 18 which, in turn, is controlled by the timer 19.

For Ge and GaAs, different dilutions of a reference NaOCl solution and different quantities of these diluted solutions are necessary at each application interval. Thus, using as a reference NaOCl solution, one containing 62 mg. of available $Cl_2$ per mil of solution, different dilutions are required for satisfactorily polishing Ge and GaAs. These dilutions are determined for both an upper and a lower limit. The upper limit is the minimum dilution of the reference solution that will not result in wafers exhibiting pitting, oxide films or a cobblestone surface. The minimum dilution value represents that concentration providing fastest satisfactory polishing. In the case of Ge, its value is approximately 2 volumes deionized water per volume reference solution or approximately 21 mg. of available $Cl_2$ per mil of polishing solution. Solutions more concentrated than this have always yielded undesirable surface characteristics as a result of the polishing process, namely, the single crystal Ge wafers begin to exhibit pits and a cobblestone appearance. In the case of GaAs, the minimum dilution value is approximately 10 volumes deionized water per volume of reference solution, i.e., approximately 6.2 mg. of available $Cl_2$ per mil of polishing solution. In addition to causing pitting, stronger GaAs solutions result in severe oxidation of the surfaces evident by the formation of a black film. As increasingly dilute solutions are used, the polishing rate in mils removed per hour decreases, and after a certain dilution value is reached, the removal rate for practical purposes approaches zero. With Ge, this maximum dilution value is approximately five parts deionized water by volume per volume of reference solution (i.e., 12 mg. available $Cl_2$ per mil of polishing solution). For GaAs, the maximum dilution value is approximately 25 volumes of deionized water per volume of reference solution (i.e., approximately 2.5 mg. per mil of polishing solution). Thus, the concentration of available $Cl_2$ (not based on any particular reference solution) is approximately 15.5–20.7 mg./milliliter for germanium and approximately 2.38–4.6 mg./milliliter for gallium arsenide.

The application rate and quality of resulting polished wafers are also interdependent. For the concentration ranges specified above, preferably 2–3/1, for Ge and 12.5–25/1 for GaAs, the following application rates provide the best polishes: at one minute intervals, 2.5 mils of polishing solution per application are preferable for GaAs and for the same time interval 1 mil applications are preferable for Ge. The lapping wheel rotation speed is critical only in that the plate must not rotate so fast as to run dry between applications due to centrifuging the liquid from the cloth, and not so slow that the contact of the wafers with fresh polishing solution reduces etching below some practical value. A preferable lapping plate rotation speed is about 62 r.p.m. The total polishing time depends upon the extent of saw cut and lapping damage. These damages generally extend from 2–8 mils into the surface. The process of the invention results in removal rates of from .7 mil/hr. for the more dilute polishing solution to approximately 2 mils/hr. for the more concentrated solutions. These removal rates apply to each of the semiconductor materials.

The available chlorine referred to above represents the quantity of free chlorine that can be liberated from a highly acidified Na oxychloride solution. Effectively, it represents twice the chlorine content due to the $OCl^-$ anion in the oxychloride solution. If there exist 31 milligrams per milliliter of monatomic chlorine derived from the $OCl^-$ anion in any oxychloride solution, the available chlorine content is reported at 62 milligrams per milliliter. This arises because all the known methods of preparing NaOCl solutions (NaOCl does not exist in a solid state) are accompanied by the formation of at least one mole of $Cl^-$ anion for each mole of $OCl^-$ anion present. In acidified solution, the $OCl^-$ anion reacts with the $Cl^-$ anion to form free $Cl_2$. It is this free chlorine whose molar quantity is equal to the $OCl^-$ molar quantity which is determined analytically. The polished wafers resulting from the process are useful as starting materials for fabrication of diodes and transistors or as substrates for deposition via vapor growth processes of single crystal semiconductors. The grown layers may then be fabricated into diodes and transistors. The high quality, damage-free wafers resulting from the process of the invention are highly desirable in applying planar technological batch fabrication techniques for production of diodes and transistors. Fabricated semiconductor devices are useful in radios, computer mechanisms, and other places where vacuum tubes may be employed.

For simplicity, the following examples in Table I all utilize a reference NaOCl solution containing 62 mg. of available $Cl_2$ per mil diluted with deionized water to final values specified in each of the examples. The single crystal wafers employed were cut to a thickness of approximately 20 mils using a high speed diamond saw. They were affixed to 4-inch quartz discs with glycol phthalate and then lapped with a sequence of 9, 5, and 3 micron $Al_2O_3$ lapping grits until all saw marks were removed. While still affixed to their quartz plate, the wafers were cleaned ultrasonically in dilute anionic detergent solution (.8 gm. detergent to 950 mils water). A suitable anionic detergent composition contains hydrocarbon and alkyl aryl sulfonates, fatty alcohol sulfates and complex alkali metal phosphates (e.g., Alconox). The detergent treatment is followed by 6 ultrasonic rinses in deionized water, three ultrasonic rinses in transistor grade trichloroethylene and 3 ultrasonic rinses in transistor grade methyl alcohol. The wafers were blown dry with a stream of nitrogen and the wafer-plate assembly was mounted on the lapping wheel as shown in FIG. 3. No pressure other than provided by the weight of the wafer-plate assembly itself was applied.

TABLE I

| Ex. No. | Material | Orientation | Conductivity Type Dopant and Dopant Concentration In Atoms/cc. | Dilution Value of Ref. Solution: Volumes Deionized Water per Vol. of Ref. Solution | Lapping Wheel Speed | Interval Between Application of Polishing Solution, minute | Quantity of Polishing Solution Applied at Each Interval, mil | Results |
|---|---|---|---|---|---|---|---|---|
| 1 | Ge | <111> | n-type As $10^{15}$ | 2/1 | 62 | 1 | 1 | High polish, damage free, planar. |
| 2 | Ge | <111> | n-type As $10^{17}$ | 3/1 | 50 | 1 | 1 | Do. |
| 3 | Ge | <111> | p-type Ga $10^{16}$ | 2/1 | 74 | 1 | 1 | Do. |
| 4 | Ge | <111> | p-type Ga $10^{18}$ | 2/1 | 62 | 1 | 1 | Do. |
| 5 | Ge | <211> | p-type Ga $10^{17}$ | 3/1 | 62 | 1 | 1 | Do. |
| 6 | Ge | <110> | n-type Sb $10^{16}$ | 2/1 | 62 | 1 | 1 | Do. |
| 7 | Ge | <100> | p-type Ga $10^{17}$ | 2/1 | 62 | 1 | 1 | Do. |
| 8 | Ge | <100> | n-type As $10^{17}$ | 1/1 | 62 | 1 | 1 | Pitted surface exhibiting cobblestone appearance. |
| 9 | Ge | <111> | n-type As $10^{16}$ | 5/1 | 62 | 1 | 1 | Removal rate almost negligible. |
| 10 | GaAs | <111> Ga face | n-type Te $10^{17}$ | 25/1 | 62 | 1 | 2.5 | High polish, damage free, planar. |
| 11 | GaAs | <111> As face | n-type Se $10^{18}$ | 12.5/1 | 62 | 1 | 2.5 | Do. |
| 12 | GaAs | <211> | p-type Zn $10^{16}$ | 20/1 | 62 | 1 | 2.5 | Do. |
| 13 | GaAs | <110> | p-type Zn $10^{18}$ | 25/1 | 62 | 1 | 2.5 | Do. |
| 14 | GaAs | <100> | n-type Te $10^{18}$ | 12.5/1 | 62 | 1 | 2.5 | Do. |
| 15 | GaAs | <111> Ga face | n-type Te $10^{17}$ | 8/1 | 62 | 1 | 2.5 | Surface oxidized and pitted. |
| 16 | GaAs | <111> Ga face | n-type Se $10^{16}$ | 35/1 | 62 | 1 | 2.5 | Removal rate negligible. |

Due to the effects of surface tension, the nap of the polishing cloth is contained within the liquid layer formed between the Ge or GaAs and the polishing cloth. In addition, the wafer-plate assembly via a buoyancy effect tends to float on the liquid layer with the rough protrusions of the single crystal wafers formed during the lapping operation submerged within the liquid layer. Since these protrusions are in closer proximity to the nap, they are subjected to greater polishing solution turbulence created by this nap and, consequently, are removed at a rapid rate. The valleys between the protrusions lying as it were above the region of maximum turbulence are not subjected to as rapid a replenishment of polishing solution. Consequently, the valleys etch at a slower rate than do the protrusions. When the protrusions have been etched away, the relative etching rate of the valleys and what remains of the protrusions become comparable. Finally, a smooth surface is presented to the turbulent area and the etching then proceeds uniformly over the entire surface. The etching action discussed leads to enhancement of planarity and the highly polished, damage-free surface when subjected to standard planar surface tests exhibits a highly planar surface comparable to what can be obtained with standard mechanical polishing technical techniques.

Thus, there has been disclosed a process for chemically polishing single crystal wafers of germanium and gallium arsenide so as to obtain planar, damage-free surfaces which uses sodium oxychloride solutions in conjunction with a rotating wheel assembly to achieve non-selective polishing of all common germanium and gallium arsenide crystallographic orientations. This process for polishing all common germanium and gallium arsenide crystallographic orientations is independent of the doping level and resistivity type and produces a highly polished planar, damage-free surface.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of chemically polishing a surface of a single crystal semi-conductor wafer selected from the group consisting of Ge and GaAs to obtain a damage-free, planar surface comprising the steps of:

(a) positioning said surface of said wafer in close adjacency to a flat fabric polishing medium;

(b) providing a predetermined relative motion between said wafer and said polishing medium parallel to said surface;

(c) periodically injecting a solution of a metal oxyhalide selected from the group consisting of KOCl and NaOCl in predetermined quantity and in predetermined concentration between the wafer and the surface of the polishing medium so as to maintain a liquid layer of said solution in contact with said medium and said wafer and (d) removing waste products resulting from polishing.

2. The method of chemically polishing a surface of a semi-conductor wafer selected from the group consisting of Ge and GaAs to obtain a damage free, planar surface comprising the steps of:

(a) positioning said wafer in close adjacency to a flat fabric polishing medium;

(b) providing relative motion between said wafer and said medium in a plane parallel to said medium; and (c) injecting a controlled flow of an alkali metal oxyhalide solution to establish a liquid layer between said wafer and said polishing medium to produce a thickness of liquid in said layer such that said surface and said medium are in contact with said liquid layer.

3. The method of chemically polishing as set forth in claim 2 wherein said solution is an alkali metal oxychloride solution.

4. The method of chemically polishing as set forth in claim 3 wherein said solution is an alkali metal oxychloride selected from the group consisting of KOCl and NaOCl.

5. A method of chemically polishing as set forth in claim 1 wherein said predetermined concentration of said metal oxyhalide solution contains approximately 15.5–20.7 mg./milliliter of available $Cl_2$ for germanium and approximately 2.38–4.6 mg./milliliter of available $Cl_2$ for gallium arsenide.

References Cited

UNITED STATES PATENTS

| | | | |
|---|---|---|---|
| 2,690,383 | 9/1954 | Bradshaw | 156—17 |
| 3,032,936 | 5/1962 | Voice | 51—124 |
| 3,073,764 | 1/1963 | Sullivan. | |
| 3,226,277 | 12/1965 | Masuda et al. | 156—345 |

JACOB STEINBERG, *Primary Examiner.*

ALEXANDER WYMAN, *Examiner.*